United States Patent
Obana et al.

(10) Patent No.: US 9,835,692 B2
(45) Date of Patent: Dec. 5, 2017

(54) MAGNETIC DETECTION DEVICE

(71) Applicant: ALPS ELECTRIC CO., LTD., Tokyo (JP)

(72) Inventors: Masayuki Obana, Niigata-ken (JP); Hideto Ando, Niigata-ken (JP); Tsutomu Takeya, Niigata-ken (JP); Kazuaki Kaneko, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 269 days.

(21) Appl. No.: 14/533,570

(22) Filed: Nov. 5, 2014

(65) Prior Publication Data
US 2015/0130453 A1 May 14, 2015

(30) Foreign Application Priority Data

Nov. 14, 2013 (JP) .................. 2013-235640

(51) Int. Cl.
*G01R 33/00* (2006.01)
*G01R 33/09* (2006.01)

(52) U.S. Cl.
CPC ....... *G01R 33/0017* (2013.01); *G01R 33/093* (2013.01)

(58) Field of Classification Search
CPC .. G01R 33/093; G01R 33/0017; G01R 33/00; G01R 33/09
USPC ........................................................ 324/225
See application file for complete search history.

(56) References Cited

U.S. PATENT DOCUMENTS

| | | | | |
|---|---|---|---|---|
| 5,721,654 A | * | 2/1998 | Manako | B82Y 25/00 360/110 |
| 6,090,480 A | * | 7/2000 | Hayashi | B82Y 10/00 257/E43.004 |
| 6,687,099 B2 | * | 2/2004 | Nakatani | B82Y 10/00 257/E43.004 |
| 2010/0119875 A1 | * | 5/2010 | Sasaki | B82Y 10/00 428/812 |
| 2012/0280677 A1 | | 11/2012 | Furukawa et al. | |
| 2014/0138346 A1 | * | 5/2014 | Whig | B82Y 25/00 216/19 |

FOREIGN PATENT DOCUMENTS

| | | |
|---|---|---|
| CN | 102741661 A | 10/2012 |
| CN | 103299202 A | 9/2013 |
| EP | 2 664 940 A1 | 11/2013 |
| WO | WO 2011/068146 A1 | 9/2011 |

* cited by examiner

*Primary Examiner* — Son Le
*Assistant Examiner* — Akm Zakaria
(74) *Attorney, Agent, or Firm* — Brinks Gilson & Lione

(57) ABSTRACT

A magnetic field component in a Z direction is guided by a magnetic field guide layer and applied to a magnetic sensor in an X direction that is the same as a sensitivity axis direction thereof, and a detection output is obtained. A bridge circuit is formed with a plurality of magnetic sensors and configured such that an output is not provided for a magnetic field component in the X direction. However, when an external magnetic field in the X direction is drawn to the magnetic field guide layer, variation of sensitivity for the X direction may occur. Thus, soft magnetic characteristics of a first portion of the magnetic field guide layer are deteriorated to decrease the magnetic permeability of the first portion.

15 Claims, 10 Drawing Sheets

MAGNETIC DETECTION DEVICE

CLAIM OF PRIORITY

This application claims benefit of priority to Japanese Patent Application No. 2013-235640 filed on Nov. 14, 2013, which is hereby incorporated by reference in its entirety.

BACKGROUND

1. Field of the Disclosure

The present disclosure relates to a magnetic detection device that detects, with a magnetic sensor such as a GMR element, a magnetic field component in a direction perpendicular to a sensitivity axis thereof.

2. Description of the Related Art

In each of magnetic detection devices disclosed in Japanese Unexamined Patent Application Publication No. 2009-276159 and International Publication No. 2011/068146, a bridge circuit is composed of magnetoresistance effect elements a sensitivity axis of each of which is directed in the horizontal direction, and each magnetoresistance effect element is provided with magnetic bodies that are each formed from a soft magnetic material extending in the vertical direction and opposed to each other. A magnetic field component in the vertical direction is guided by the magnetic bodies, and a component, in the horizontal direction, of a leakage flux from a lower end portion of each magnetic body is detected with the magnetoresistance effect element. Accordingly, it is possible to detect the intensity of a magnetic field in the vertical direction.

In the magnetic detection device, it is required that a detection output based on a component, in the horizontal direction, of an external magnetic field is not superimposed on an original detection output. Thus, the bridge circuit is configured such that even when the resistance values of the respective magnetoresistance effect elements are changed by a magnetic field component in the horizontal direction, the changes are cancelled out.

In the magnetic detection device, each magnetic body for guiding a magnetic field in the vertical direction is formed from a soft magnetic material having a high magnetic permeability. However, if the magnetic permeability of each magnetic body is high, the sensitivity is varied with respect to a magnetic field component in the horizontal direction that originally should not be detected.

That is, in such a magnetic detection device, when a magnetic field component in the horizontal direction is applied to a plurality of magnetoresistance effect elements at the same intensity, even if the resistance values of the magnetoresistance effect elements are changed, the changes of the resistance values are cancelled out so as not to appear as a detection output. However, if the magnetic permeability of each magnetic body is high, since a magnetic field component in the horizontal direction is drawn to the magnetic bodies, the intensity of the magnetic field in the horizontal direction applied to each magnetoresistance effect element is likely to be varied. If the variation is increased, it is made impossible to cancel out the changes of the resistance values in the bridge circuit, and a detection output corresponding to the intensity of a magnetic field in the horizontal direction that originally should not be detected appears as detection noise.

Therefore, a counter-measure is conceivable that the soft magnetic characteristics of each magnetic body are deteriorated to decrease the magnetic permeability thereof, whereby a magnetic field component in the horizontal direction is less likely to be drawn to the magnetic body. However, when the soft magnetic characteristics of the magnetic body are deteriorated, a coercive force thereof is increased. Thus, when a relatively great external magnetic field is applied, magnetization is likely to remain within the magnetic body. As a result, in detecting a magnetic field component in the vertical direction, an offset component is superimposed on a detection output, and the sensitivity is varied.

The present invention solves the above problems of the related art and provides a magnetic detection device having a structure in which a magnetic field component directed in a sensitivity axis of a magnetic sensor is less likely to be superimposed as noise and the magnetic detection device is less subject to influence of a strong magnetic field externally applied thereto.

SUMMARY

A magnetic detection device according to an aspect of the present invention includes: a magnetic field guide layer configured to guide a magnetic field component in a first direction; and a magnetic sensor located on a virtual surface facing an end portion of the magnetic field guide layer, the magnetic sensor having a sensitivity axis in a second direction perpendicular to the first direction. The magnetic field guide layer includes a first portion facing the magnetic sensor and a second portion away from the magnetic sensor, and a magnetic permeability of the first portion is lower than that of the second portion.

In the magnetic detection device according to the aspect of the present invention, the magnetic permeability of the first portion of the magnetic field guide layer configured to guide a magnetic field component in the first direction is set low. Thus, a magnetic field component in the second direction is less likely to be drawn to the magnetic field guide layer, and it is possible to suppress variation of the sensitivity of the magnetic sensor with respect to the magnetic field component in the second direction. Therefore, it is possible to reduce detection noise by a magnetic field component in the second direction which is not an original detection direction.

In addition, since the soft magnetic characteristics of the second portion are made high, it is possible to keep the soft magnetic characteristics high in the entire magnetic field guide layer, and it is possible to decrease the coercive force of the entire magnetic field guide layer. Thus, even when a great external magnetic field is applied, great magnetization is prevented from remaining in the magnetic field guide layer. Accordingly, it is possible to prevent occurrence of an offset of a detection output and occurrence of variation of the sensitivity.

DESCRIPTION OF THE EXEMPLARY EMBODIMENTS

Figure 1:
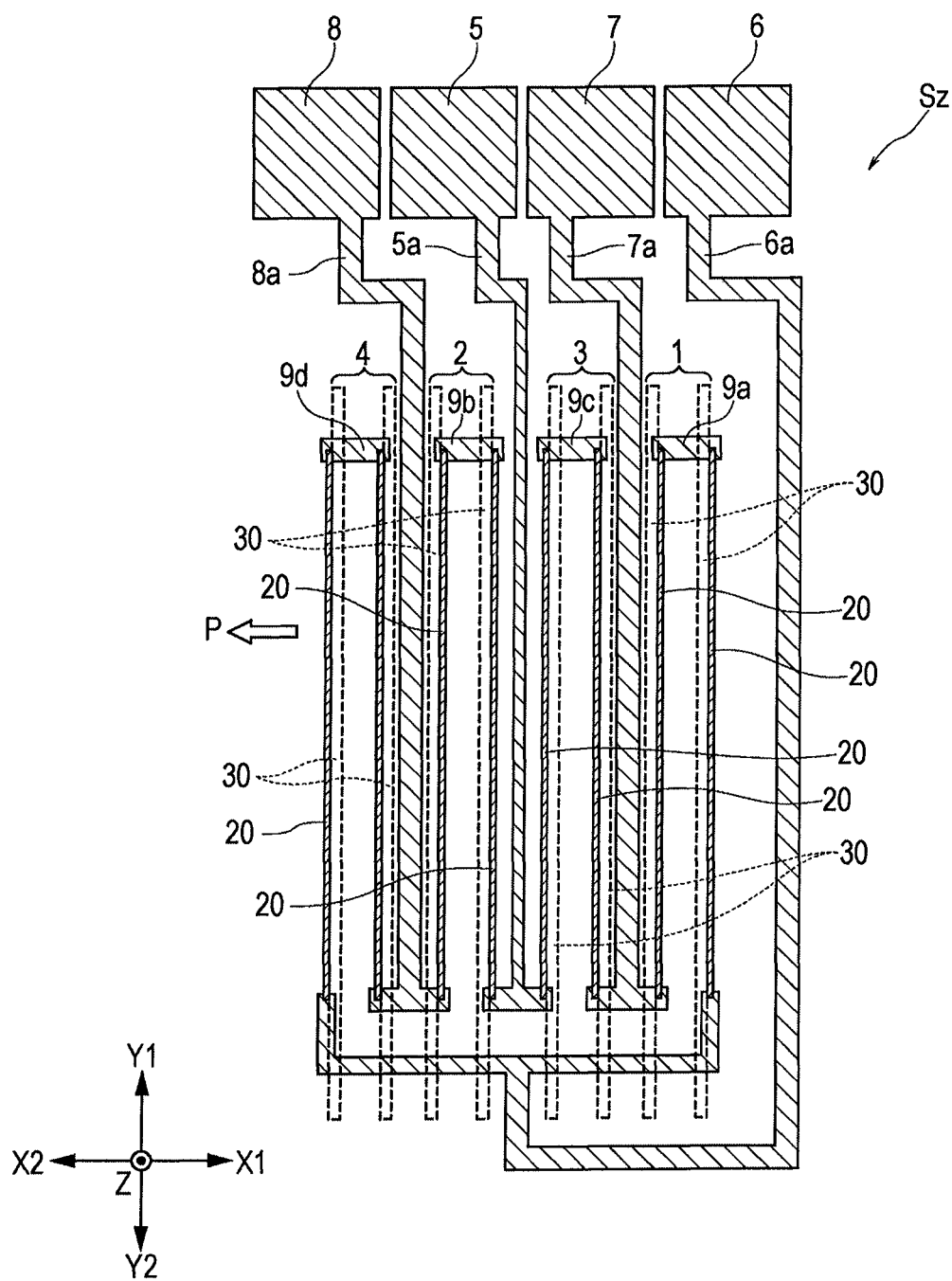
FIG. 1 is a plan view showing the entire structure of a magnetic detection device according to an embodiment of the present invention.

A magnetic detection device Sz shown in FIG. 1 detects a (first) component, in a Z direction, of an external magnetic field. The magnetic detection device Sz is combined with a magnetic detection device Sx that detects a component, in an X direction (second direction), of an external magnetic field and a magnetic detection device Sy that detects a component, in a Y direction, of the external magnetic field, thereby forming a magnetic sensor that is able to detect external magnetic fields in three directions perpendicular to each other. This magnetic sensor is used as a geomagnetic sensor or the like.

As shown in FIG. 1, the magnetic detection device Sz includes a first resistance change portion 1, a second resistance change portion 2, a third resistance change portion 3, and a fourth resistance change portion 4.

Figure 2:
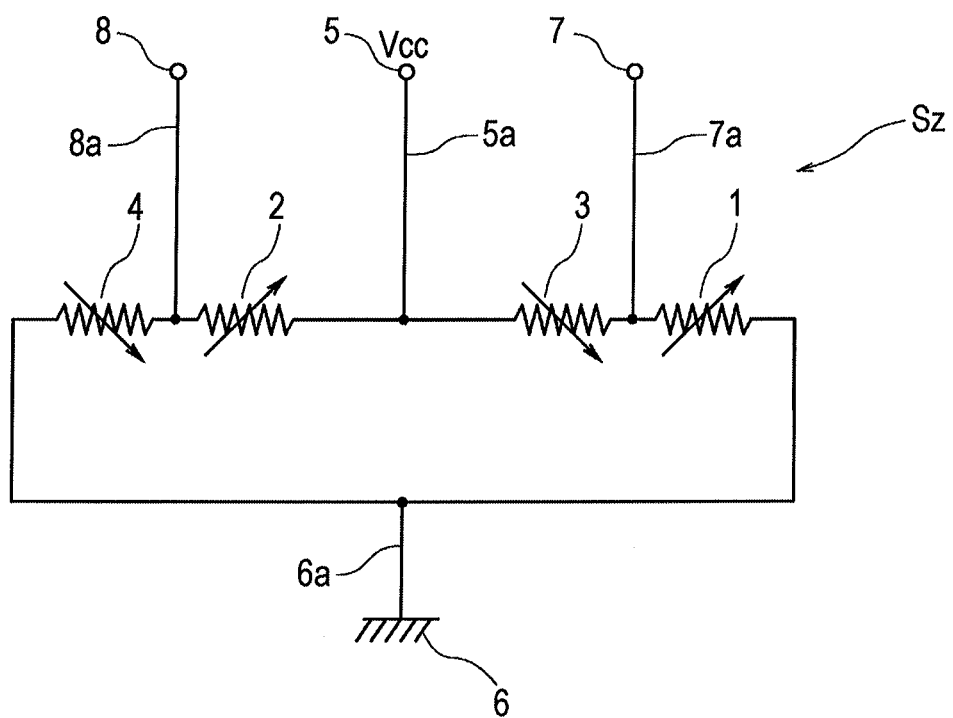
FIG. 2 is an equivalent circuit diagram of the magnetic detection device shown in FIG. 1.

As also shown in an equivalent circuit diagram of FIG. 2, the first resistance change portion 1 and the third resistance change portion 3 are connected in series, and the second resistance change portion 2 and the fourth resistance change portion 4 are connected in series. The second resistance change portion 2 and the third resistance change portion 3 are connected to a terminal 5 via a wire portion 5a, and a power supply voltage Vcc is applied to the terminal 5. A connection part between the first resistance change portion 1 and the fourth resistance change portion 4 is connected to a terminal 6 via a wire portion 6a, and the terminal 6 is grounded. An intermediate connection part between the first resistance change portion 1 and the third resistance change portion 3 is connected to a first detection terminal 7 via a wire portion 7a, and an intermediate connection part between the second resistance change portion 2 and the fourth resistance change portion 4 is connected to a second detection terminal 8 via a wire portion 8a. A differential output between an output of the first detection terminal 7 and an output of the second detection terminal 8 is a detection output of the magnetic detection device Sz.

Each of the first resistance change portion 1 to fourth resistance change portion 4 is provided with two magnetic sensors 20 elongated in the Y direction.

As shown in FIG. 1, in the first resistance change portion 1, end portions of the two magnetic sensors 20 at the Y1 side are connected to each other via a conductive connection layer 9a, that is, in the first resistance change portion 1, the magnetic sensors 20 are connected to each other in a so-called meander pattern, and thus the substantial dimension of the magnetic sensor in the Y direction is long. Similarly, in the second resistance change portion 2, end portions of the two magnetic sensors 20 at the Y1 side are connected to each other via a conductive connection layer 9b; in the third resistance change portion 3, end portions of the two magnetic sensors 20 at the Y1 side are connected to each other via a conductive connection layer 9c; and, in the fourth resistance change portion 4, end portions of the two magnetic sensors 20 at the Y1 side are connected to each other via a conductive connection layer 9d. In each of the resistance change portions 2, 3, and 4, the magnetic sensors 20 are connected to each other in a meander pattern.

The wire portions 5a, 6a, 7a, and 8a, the terminals 5, 6, 7, and 8, and the conductive connection layers 9a, 9b, 9c, and 9d are formed from a low-resistance material such as copper or silver.

Figure 3:
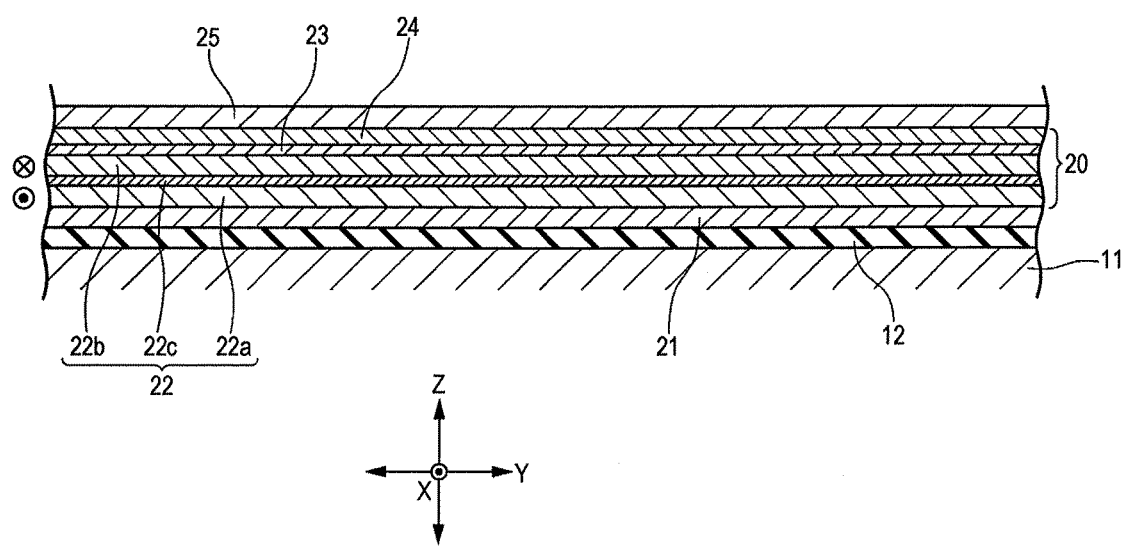
FIG. 3 is an enlarged cross-sectional view of a magnetic sensor provided in the magnetic detection device.

FIG. 3 shows a cross-sectional view of the magnetic sensor 20 taken along a cutting plane parallel to a Y-Z plane. An insulating base layer 12 is formed on a surface of a substrate 11, and the magnetic sensor 20 in which multiple metal layers are laminated is formed thereon. The metal layers composing the magnetic sensor 20 are formed by a sputter process or a CVD process.

The magnetic sensor 20 is a magnetoresistance effect element layer (GMR layer) that exerts a giant resistive effect, a fixed magnetic layer 22, a non-magnetic layer 23, and a free magnetic layer 24 are laminated on the insulating base layer 12 in this order, and the free magnetic layer 24 is covered with a protective layer 25.

The fixed magnetic layer 22 has a laminated ferri structure including a first fixed layer 22a, a second fixed layer 22b, and a non-magnetic intermediate layer 22c located between the first fixed layer 22a and the second fixed layer 22b. The first fixed layer 22a and the second fixed layer 22b are formed from a soft magnetic material such as a Co Fe alloy (cobalt-iron alloy). The non-magnetic intermediate layer 22c is formed from Ru (ruthenium) or the like.

The fixed magnetic layer 22 with the laminated ferri structure has a so-called self-pin structure in which magnetization of the first fixed layer 22a and magnetization of the second fixed layer 22b are fixed antiparallel. The self-pin structure does not use an antiferromagnetic layer in order to fix the magnetization of the fixed magnetic layer 22. In a structure using an antiferromagnetic layer, the antiferromagnetic layer and a fixed magnetic layer are laminated and thermally treated in a magnetic field, whereby magnetization of the fixed magnetic layer is fixed, but, in the fixed magnetic layer 22 with the laminated ferri structure, the direction of the magnetization is fixed by antiferromagnetic coupling between the first fixed layer 22a and the second fixed layer 22b without thermal treatment in magnetization.

The direction in which magnetization of the fixed magnetic layer 22 is fixed is the magnetization direction of the second fixed layer 22b, and in each of the resistance change portions 1, 2, 3, and 4, the direction of fixed magnetization P of the fixed magnetic layer 22 is preferably directed in an X2 direction that is the second direction.

The non-magnetic layer 23 shown in FIG. 3 is formed from a non-magnetic material such as Cu (copper). The free magnetic layer 24 is formed from a soft magnetic material such as a Ni Fe alloy (nickel-iron alloy). The free magnetic layer 24 has a length dimension in the longitudinal direction thereof (Y direction) sufficiently larger than a width dimension in the lateral direction thereof (X direction), and magnetization thereof is directed in the X2 direction due to the shape anisotropy thereof. Therefore, the free magnetic layer 24 does not have a longitudinal bias applying structure for directing the magnetization of the free magnetic layer 24 in the longitudinal direction. When the fixed magnetic layer 22 has a laminated ferri structure and thermal treatment in a magnetic field is unnecessary, magnetic anisotropy of the free magnetic layer 24 is easily maintained. The protective layer 25, which covers the free magnetic layer 24, is formed from Ta (tantalum) or the like.

As shown in FIG. 1, in each of the resistance change portions 1, 2, 3, and 4, magnetic field guide layers 30 are provided so as to face the magnetic sensors 20, respectively. As shown in FIG. 1, a plurality of magnetic field guide layers 30 are provided, extend linearly in the Y direction, and are arranged parallel to each other. In addition, as shown in FIGS. 4A to 5B, each magnetic field guide layer 30 is formed in a shape of a wall so as to stand in the Z direction.

As shown in FIG. 3, in the magnetic sensor 20, the free magnetic layer 24 is covered with the protective layer 25, an insulating layer, which is not shown, is formed on the protective layer 25, the upper surface of the insulating layer is processed into a flat surface, and the magnetic field guide layer 30 is formed thereon by a plating process or the like.

Figure 4A:
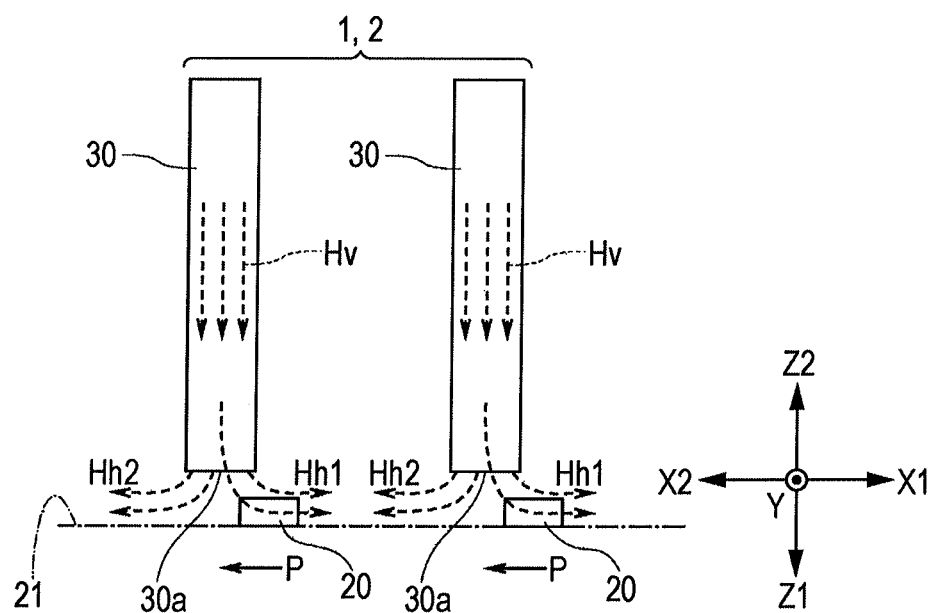
FIG. 4A is an explanatory diagram showing an operation in which magnetic field components guided by magnetic field guide layers are detected with a first resistance change portion and a second resistance change portion.
Figure 4B:
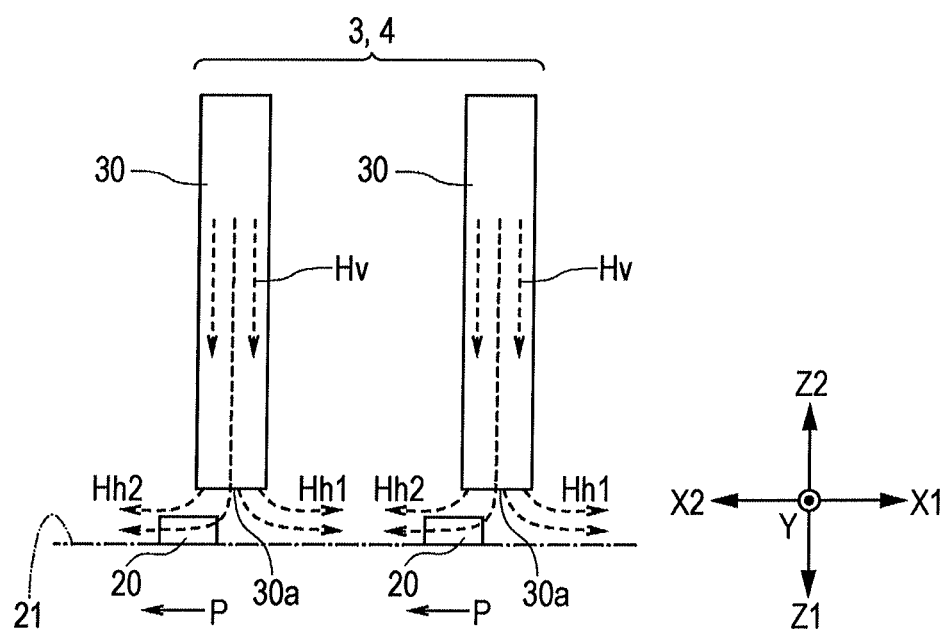
FIG. 4B is an explanatory diagram showing an operation in which magnetic field components guided by magnetic field guide layers are detected with a third resistance change portion and a fourth resistance change portion.

Each magnetic field guide layer 30 is formed from a soft magnetic material. As shown in FIG. 4A, in the first resistance change portion 1 and the second resistance change portion 2, the magnetic sensors 20 are arranged on a virtual surface (virtual plane) 21 that faces a lower surface 30a of each magnetic field guide layer 30 so as to be spaced apart therefrom. The center of each magnetic sensor 20 is offset in an X1 direction from the width center of the lower surface 30a in the X direction. As shown in FIG. 4B, also in the third resistance change portion 3 and the fourth resistance change portion 4, the magnetic sensors 20 are arranged on a virtual surface (virtual plane) 21 that faces a lower surface 30a of each magnetic field guide layer 30 so as to be spaced apart therefrom, and the center of each magnetic sensor 20 is offset in the X2 direction from the width center of the lower surface 30a in the X direction.

In FIGS. 4A and 4B, each magnetic sensor 20 is arranged such that the lower surface 30a of the magnetic field guide layer 30 and a portion of the magnetic sensor 20 overlap each other in the Z direction. However, as shown in an embodiment of FIG. 6, in the first resistance change portion 1 and the second resistance change portion 2, each magnetic sensor 20 may be arranged such that the magnetic sensor 20 does not overlap the lower surface 30a of the magnetic field guide layer 30 in the Z direction. This is the same also in the third resistance change portion 3 and the fourth resistance change portion 4.

Figure 6:
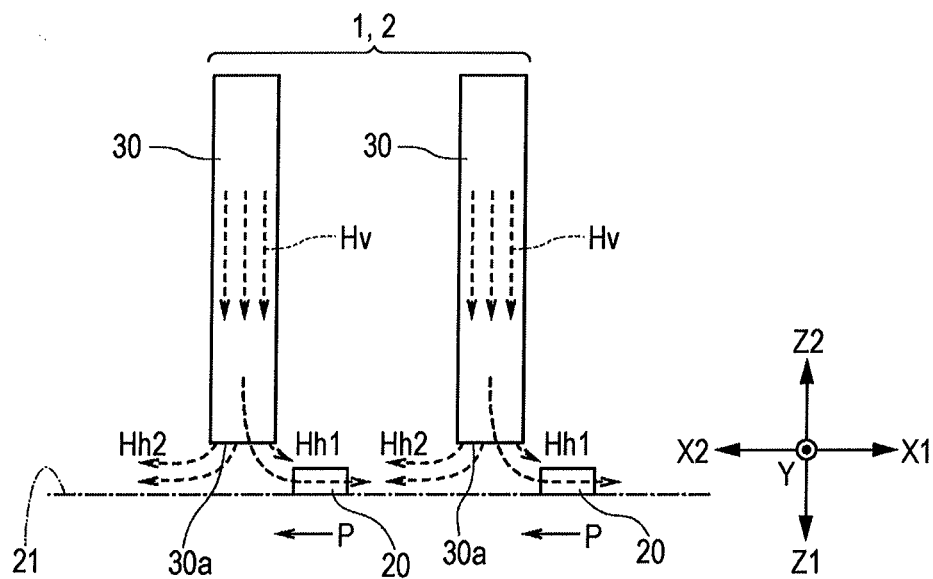
FIG. 6 is an explanatory diagram showing a modification of an arrangement of the magnetic field guide layers and the magnetic sensors.

In addition, in the embodiment of FIG. 6, the virtual surface 21 may be located on a plane on which the lower surface 30a of the magnetic field guide layer 30 is located. In this case as well, when a magnetic field is guided in a first direction (Z direction) by the magnetic field guide layer 30, it is possible to detect, with the magnetic sensor 20, a component, in the second direction (X direction), of a leakage magnetic field from the lower surface 30a.

That is, in the present invention, when the virtual surface 21 formed so as to face the lower surface (end face) 30a of each magnetic field guide layer 30 and be perpendicular to the magnetic field guide layer 30 is assumed, each magnetic sensor 20 needs to be arranged on the virtual surface 21 and be offset in the second direction from the width center of the lower surface 30a. For example, the virtual surface 21 is a surface of the substrate or a surface of a support member that supports the magnetic sensor 20.

An offset distance by which each magnetic sensor 20 is offset in the X1 direction from the center of the lower surface 30a in the first resistance change portion 1 and the second resistance change portion 2 and an offset distance by which each magnetic sensor 20 is offset in the X2 direction from the center of the lower surface 30a in the third resistance change portion 3 and the fourth resistance change portion 4 are set such that the absolute values thereof are equal to each other.

FIGS. 4A and 4B show a state where the magnetic detection device Sz detects a magnetic field component Hv in a Z1 direction. The magnetic field component Hv in the Z1 direction is guided by each magnetic field guide layer 30, and a magnetic field coming out from the lower surface 30a of the magnetic field guide layer 30 is planarly dispersed. As shown in FIG. 4A, in the first resistance change portion 1 and the second resistance change portion 2, a magnetic field component Hh1 directed in the X1 direction is detected with each magnetic sensor 20. As shown in FIG. 4B, in the third resistance change portion 3 and the fourth resistance change portion 4, a magnetic field component Hh2 directed in the X2 direction is detected with each magnetic sensor 20.

In the resistance change portions 1, 2, 3, and 4, in each magnetic sensor 20, the direction of the fixed magnetization P of the fixed magnetic layer 22 is the X2 direction. In the first resistance change portion 1 and the second resistance change portion 2 shown in FIG. 4A, the electrical resistance value of each magnetic sensor 20 increases as the intensity of the magnetic field component Hv in the Z1 direction increases. In the third resistance change portion 3 and the fourth resistance change portion 4 shown in FIG. 4B, the electrical resistance value of each magnetic sensor 20 decreases as the intensity of the magnetic field component Hv in the Z1 direction increases.

As a result, as shown in the equivalent circuit diagram of FIG. 2, a voltage of the detection terminal 7 located midway between the third resistance change portion 3 and the first resistance change portion 1, which are connected in series, changes, and a voltage of the detection terminal 8 located midway between the second resistance change portion 2 and the fourth resistance change portion 4, which are connected in series, changes. The changes of the voltages of the detection terminal 7 and the detection terminal 8 are opposite to each other in polarity. Thus, it is possible to detect the intensity of the magnetic field component Hv in the Z1 direction by obtaining the difference in voltage between the detection terminal 7 and the detection terminal 8.

In addition, a magnetic field component directed in a Z2 direction is also guided by each magnetic field guide layer 30. At that time, a magnetic field component in the X direction is detected with each magnetic sensor 20. Thus, it is also possible to detect the intensity of the magnetic field in the Z2 direction.

Meanwhile, the magnetic detection device Sz is basically configured not to have sensitivity to a magnetic field component in the X direction which is the second direction.

Figure 5A:
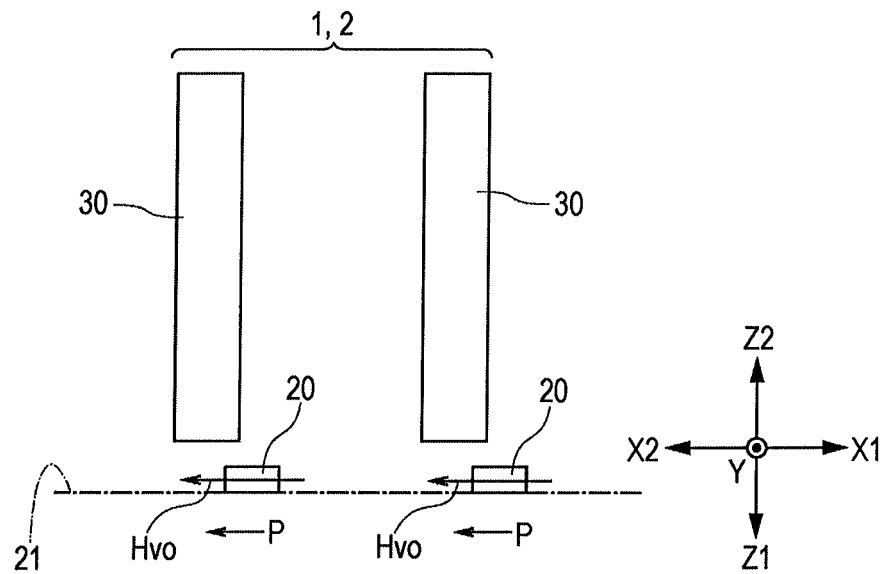
FIG. 5A is an explanatory diagram showing a state where an external magnetic field in a second direction is applied to the first resistance change portion and the second resistance change portion.
Figure 5B:
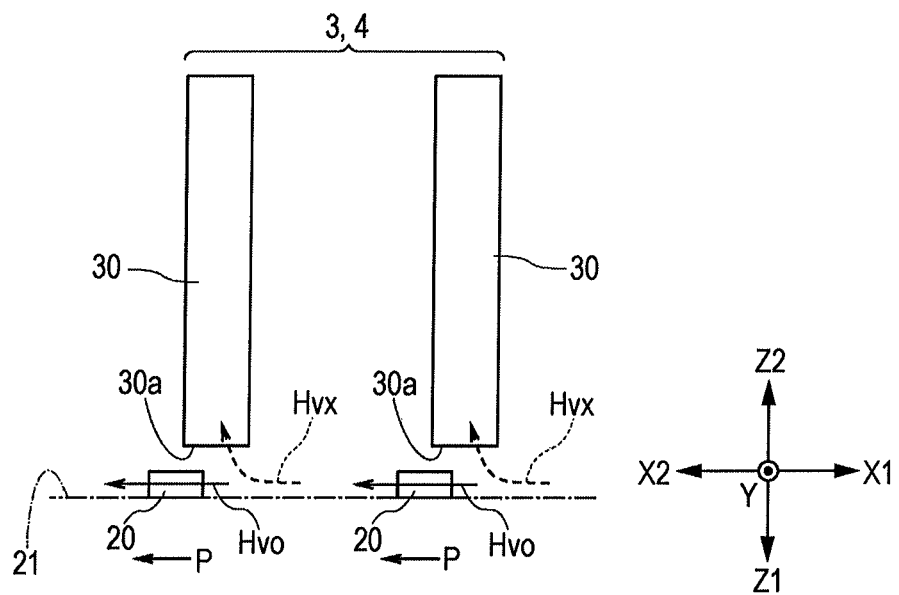
FIG. 5B is an explanatory diagram showing a state where an external magnetic field in the second direction is applied to the third resistance change portion and the fourth resistance change portion.

In the first resistance change portion 1 and the second resistance change portion 2 shown in FIG. 5A, the direction of the fixed magnetization P of the fixed magnetic layer 22 of each magnetic sensor 20 is the same as that in the third resistance change portion 3 and the fourth resistance change portion 4 shown in FIG. 5B. As shown in FIGS. 5A and 5B, when a magnetic field component Hv in the X2 direction is applied to the magnetic detection device Sz, the resistance value decreases in each of the resistance change portions 1, 2, 3, and 4, and thus the potential between the first detection terminal 7 and the second detection terminal 8 does not change. Therefore, the detection output of the magnetic detection device Sz does not change. This is the same also when a magnetic field component in the X1 direction is applied.

However, each magnetic field guide layer 30 is formed from a soft magnetic material having a high magnetic permeability, and thus, as shown in FIG. 5B, a partial component Hvx of a magnetic field component Hv0 in the X2 direction is likely to be guided by each magnetic field guide layer 30. When the partial component Hvx is guided by each magnetic field guide layer 30, the magnitudes of the magnetic field components Hv0 applied to all the magnetic sensors 20 are not uniform. As a result, each magnetic sensor 20 has sensitivity to a magnetic field component in the second direction (X direction) which originally should not be detected, and an output for the magnetic field component in the X direction is superimposed as noise on a detection output for a magnetic field component, in the Z direction which is the first direction, that should originally be detected.

Figure 7A:
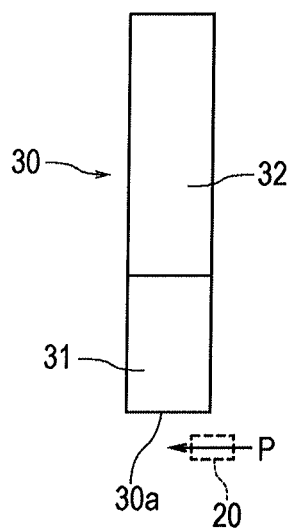
FIGS. 7A and 7B are each an explanatory diagram showing the structure of the magnetic field guide layer.

Therefore, in each magnetic field guide layer 30 in the first embodiment of the present invention, as shown in FIG. 7A, the composition of a soft magnetic material for a first portion 31 which includes the lower surface 30a and faces the magnetic sensor 20 is made different from that for a second portion 32 away from the magnetic sensor 20 such that the magnetic permeability of the first portion 31 is lower than that of the second portion 32. As a result, a magnetic field component in the X direction is less likely to be drawn to the magnetic field guide layer 30.

To decrease the magnetic permeability of the magnetic material forming the first portion 31, it is necessary to deteriorate the soft magnetic characteristics thereof, and thus the first portion 31 preferably has a coercive force slightly greater than that of the second portion 32. If the coercive force is increased, when a great external magnetic field is applied, magnetization is likely to remain within the magnetic field guide layer 30. However, since the second portion 32 is formed from a magnetic material having high soft magnetic characteristics, it is possible to prevent the coercive force from being excessively great in the entire magnetic field guide layer 30, and it is made possible to prevent great residual magnetization from occurring in the magnetic field guide layer 30.

Figure 7B:
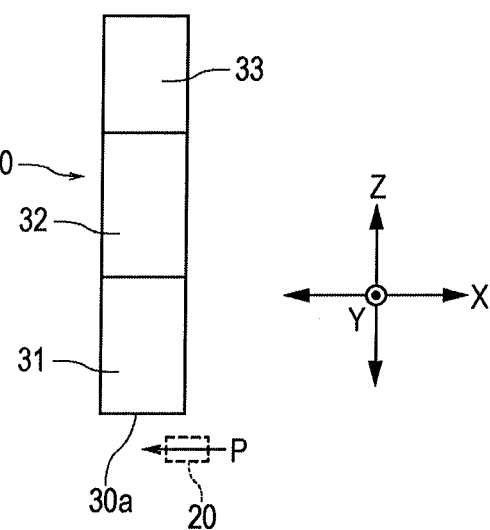

The magnetic field guide layer 30 in a second embodiment of the present invention includes a first portion 31 facing the magnetic sensor 20, a second portion 32 more away from the magnetic sensor 20, and preferably a third portion 33 further away from the magnetic sensor 20, as shown in FIG. 7B. The first portion 31 and the third portion 33 preferably have soft magnetic characteristics deteriorated more than those of the second portion 32 and have a lower magnetic permeability than that of the second portion 32.

In the embodiment shown in FIG. 7B as well, since the magnetic permeability of the first portion 31 is low, a magnetic field component in the X direction is less likely to be drawn to the magnetic field guide layer 30. In addition, if the magnetic field guide layer 30 has a three-layer structure, when a great external magnetic field is applied, residual magnetization is less likely to remain in the magnetic field guide layer 30.

The magnetic field guide layer 30 is formed from a soft magnetic material containing iron. In the embodiment of FIG. 7A, by making the iron content of the first portion 31 lower than that of the second portion 32, it is possible to slightly deteriorate the soft magnetic characteristics of the first portion 31 to decrease the magnetic permeability of the first portion 31. In the embodiment of FIG. 7B, by making the iron content of each of the first portion 31 and the third portion 33 lower than that of the second portion 32, it is possible to decrease the magnetic permeability of each of the first portion 31 and the third portion 33.

In the case where the magnetic field guide layer 30 is formed from a Ni Fe alloy (nickel-iron alloy), the second portion 32 is preferably formed from a material containing 15 to 17 mass % of iron such that the magnetic permeability thereof is higher than that of each of the first portion 31 and the second portion 33 and the coercive force thereof is as low as possible. In addition, each of the first portion 31 and the third portion 33 preferably has an iron content of not lower than 11 mass % and not higher than 14 mass %.

In the case where the magnetic field guide layer 30 is formed from a Fe Co Ni alloy (iron-cobalt-nickel alloy), a material containing 80 to 85 mass % of Ni and 3 mass % or lower of Co is preferably used for the second portion 32 such that the magnetic permeability thereof is higher than that of each of the first portion 31 and the second portion 33 and the coercive force thereof is as low as possible. In addition, a material containing 86 to 92 mass % of Ni and 3 mass % or lower of Co is preferably used for the first portion 31 and the third portion 33.

In the embodiment described above, a magnetoresistance effect element layer is used as the magnetic sensor, and the direction of the fixed magnetization P of the fixed magnetic layer is a sensitivity axis thereof. However, in the present invention, the magnetic sensor may be composed of another element such as a Hall element as long as it has a sensitivity axis in the second direction (X direction).

In addition, in the case where the magnetic sensor is a magnetoresistance effect element layer, the fixed magnetic layer may not have a laminated ferri structure, and the magnetization of the fixed magnetic layer may be fixed by antiferromagnetic coupling between an antiferromagnetic layer and the fixed magnetic layer which are laminated. In addition, the magnetization of the free magnetic layer may not be directed by magnetic anisotropy, and the free magnetic layer may have a bias structure which applies a bias magnetic field in the Y direction.

EXAMPLES

Figure 9:
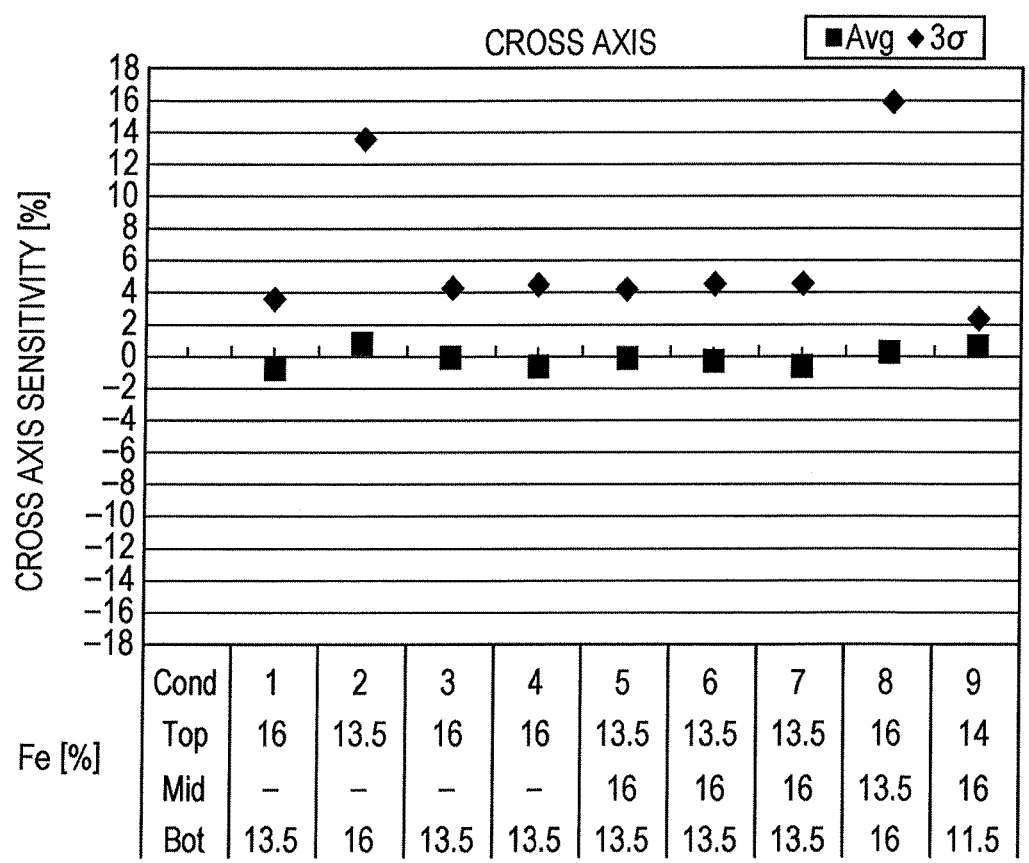
FIG. 9 is a diagram showing sensitivity to a magnetic field component in the second direction.
Figure 10:
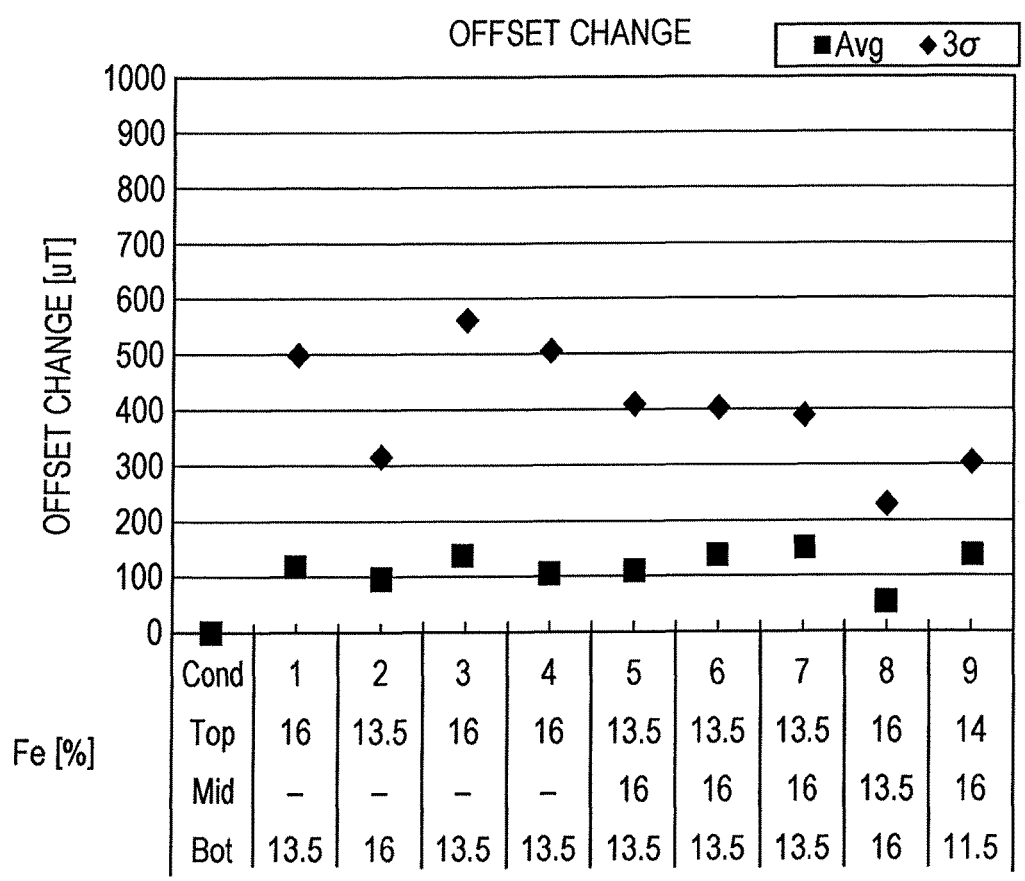
FIG. 10 is a diagram showing an offset change of a detection output when a great external magnetic field is applied to the magnetic field guide layer.
Figure 11:
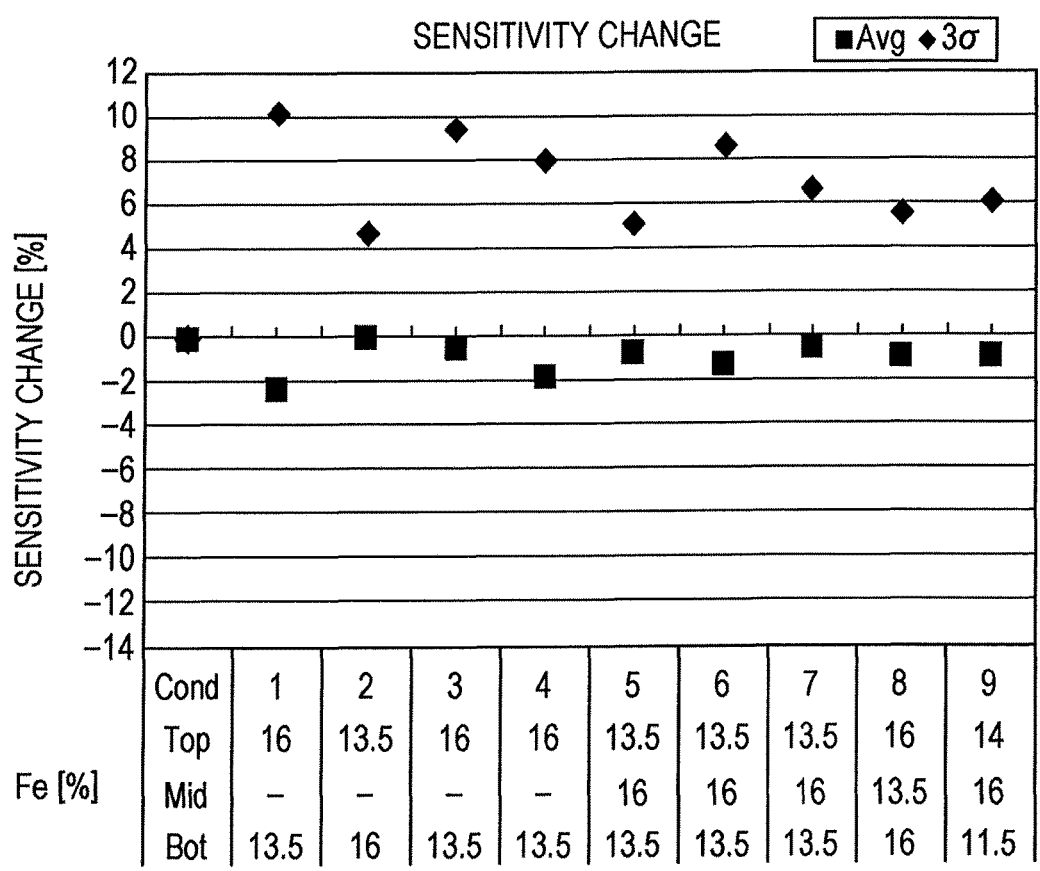
FIG. 11 is a diagram showing a sensitivity change of a detection output when a great external magnetic field is applied to the magnetic field guide layer.

Table 1 and FIGS. 9 to 11 show sample numbers 1 to 9. A plurality of magnetic detection devices Sz were formed on a single wafer together. The sample numbers 1 to 9 are wafer numbers, and a plurality of magnetic detection devices Sz of the same sample number were formed for each sample number. In an example, a detection sensitivity and an offset of a detection output were measured using each magnetic detection device Sz. The width dimension of each magnetic sensor 20 in the X direction was set to 2 μm, and the length dimension of each magnetic sensor 20 in the Y direction was set to 150 mm. The height dimension of each magnetic field guide layer 30 in the Z direction was set to 95 μm, and the width dimension of each magnetic field guide layer 30 in the X direction was set to 5 μm.

As shown in Table 1, the configurations of the magnetic field guide layers 30 of the respective samples 1 to 9 are different from each other. In Table 1, "Bot" indicates the height dimension of the first portion 31 in the Z direction, "Mid" indicates the height dimension of the second portion 32 in the Z direction, and "Top" indicates the height dimension of the third portion 33 in the Z direction. The unit of each height dimension is "μm".

Each magnetic field guide layer 30 used in the magnetic detection device Sz is an Ni Fe alloy, and, as shown in FIGS. 9 to 11, in the samples 1 to 9, the iron contents (mass %) are different from each other in each of the first portion 31 (Bot), the second portion 32 (Mid), and the third portion 33 (Top) of the magnetic field guide layer 30.

"Avg" in FIGS. 9 and 10 is the average of sensitivities of detection outputs, offset changes, or sensitivity changes obtained from the plurality of magnetic detection devices Sz formed on the same wafer, and "3σ" is the standard deviation thereof.

TABLE 1

|  | Top | Mid | Bot |
| --- | --- | --- | --- |
| Sample 1 | 5.0 |  | 4.5 |
| Sample 2 | 5.0 |  | 4.5 |
| Sample 3 | 7.0 |  | 2.5 |
| Sample 4 | 2.5 |  | 7.0 |
| Sample 5 | 1.5 | 6.5 | 1.5 |
| Sample 6 | 3.0 | 3.5 | 3.0 |
| Sample 7 | 4.0 | 1.5 | 4.0 |
| Sample 8 | 3.0 | 3.5 | 3.0 |
| Sample 9 | 1.8 | 7.3 | 1.9 |

Unit (μm)

FIG. 9 shows a sensitivity of a detection output when magnetic fields in the X1 direction and the X2 direction were alternately applied to the magnetic detection devices Sz shown in each of the samples 1 to 9. In each of the samples 1 to 9, a sensitivity of a detection output was measured using the plurality of magnetic detection devices Sz, and the average (Avg) and the standard deviation (3σ) of the sensitivities of the detection outputs for each sample are shown. Here, the detection sensitivity means the gradient of a linear change line that is obtained with a horizontal axis as the magnitude of a measurement magnetic field in the X direction and a vertical axis as the magnitude of a detection output when the measurement magnetic field is changed. This is obtained on the basis of the same idea as that for a sensitivity St in FIG. 8 described later.

In FIG. 9, it is understood that the variation of the sensitivity of the detection output was great in the samples 2 and 8 in which the iron content of the first portion 31 is large and the magnetic permeability thereof is high. This means that when a magnetic field component in the X1 direction and a magnetic field component in the X2 direction are applied, the magnetic field components are drawn to any of the magnetic field guide layers 30, resulting in variation in the magnitude of the magnetic field component in the X direction applied to the plurality of magnetic sensors 20.

From FIG. 9, it is understood that the samples 1, 3, 4, 5, 6, 7, and 9 are examples of the present invention and the samples 2 and 8 are comparative examples.

FIGS. 10 and 11 show influence of residual magnetization in each magnetic field guide layer 30 provided in the plurality of magnetic detection devices Sz for each of the samples 1 to 9. By moving a magnet close to and away from each magnetic field guide layer 30 of each magnetic detection device Sz from above, a magnetic field of 50 mT (millitesla) in the Z1 direction was applied to the magnetic field guide layer 30. Then, a detection output was measured when a measurement magnetic field having an intensity of 0.5 mT (millitesla) was applied to each magnetic detection device Sz in the Z direction. In addition, prior to applying a magnetic field of 500 mT, a measurement magnetic field was similarly applied and a detection output was measured and regarded as an original detection output.

FIG. 10 shows a magnetic field intensity (μT) to which an offset change between a detection output immediately after a magnetic field of 500 mT was applied and the original detection output is converted. FIG. 11 shows a sensitivity change representing, as a ratio (%) relative to the original sensitivity, the difference between the sensitivity of the detection output immediately after a magnetic field of 500 mT was applied and the sensitivity of the original detection output.

Figure 8:
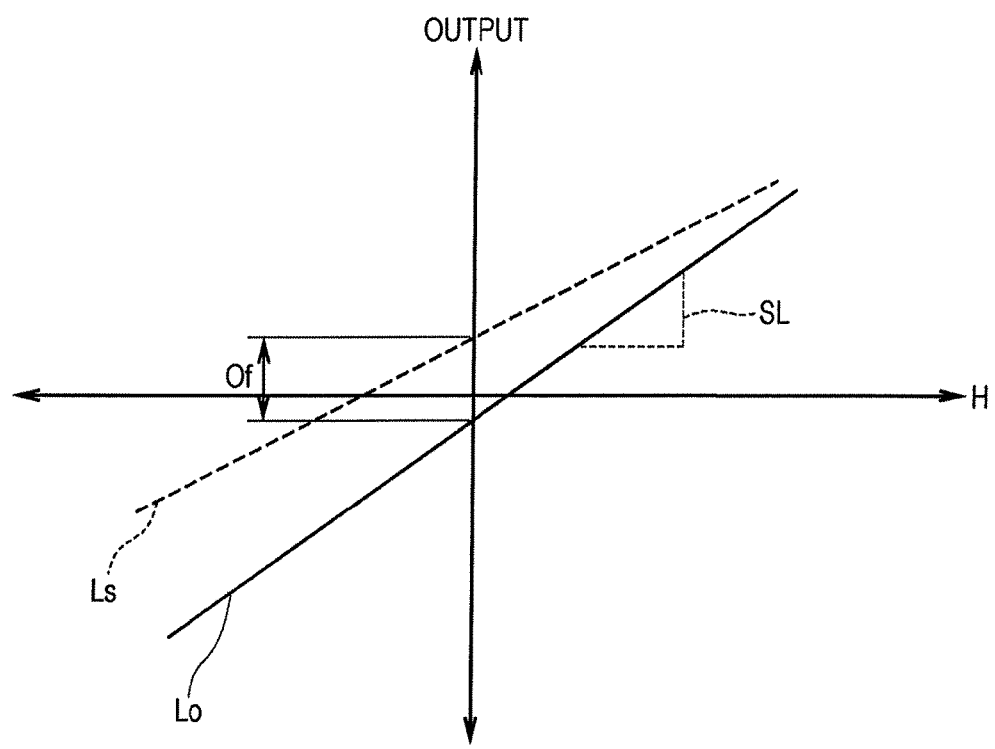
FIG. 8 is an explanatory diagram for explaining offset and sensitivity.

As shown in FIG. 8, where a linear change line of the original detection output with respect to the intensity of a measured magnetic field H when an external magnetic field for measurement was applied in the Z direction is defined as Lo and a linear change line of a detection output with respect to the intensity of a measured magnetic field H after the magnetic field of 500 mT is moved close and away is defined as Ls, an offset change is Of, and a detection sensitivity is the gradient of the linear change line Lo or Ls.

From FIGS. 10 and 11, it is understood that when the magnetic field guide layer 30 is made into a three-layer structure, resistance to an external magnetic field is improved. In addition, the iron content of the first portion 31 is preferably not lower than 11 mass % and not higher than 14 mass %. Furthermore, the thickness dimension of the first portion 31 in the first direction (Z direction) is preferably not higher than 45% of the thickness dimension of the magnetic field guide layer 30 in the first direction. From the sample 5, the lower limit thereof is 16%.

What is claimed is:

1. A magnetic detection device comprising:
   a magnetic field guide structure configured to guide a magnetic field component in a first direction; and
   a magnetic sensor disposed on a virtual surface facing the magnetic field guide structure, the magnetic sensor having a sensitivity axis in a second direction perpendicular to the first direction, wherein
   the magnetic field guide structure includes an end of a first portion facing the magnetic sensor, a second portion away from the magnetic sensor, and a third portion more away from the magnetic sensor than the second portion; and
   wherein:
   a magnetic permeability of the third portion is lower than that of the second portion,
   a magnetic permeability of the first portion is lower than that of the second portion, and
   a coercive force of the second portion is lower than that of the third portion.

2. The magnetic detection device according to claim 1, wherein a coercive force of the second portion is lower than that of the first portion.

3. The magnetic detection device according to claim 1, wherein
   the magnetic field guide structure comprises an alloy containing iron, and
   an iron content of the first portion is lower than that of the second portion.

4. A magnetic detection device comprising:
a magnetic field guide structure configured to guide a magnetic field component in a first direction; and
a magnetic sensor disposed on a virtual surface facing the magnetic field guide structure, the magnetic sensor having a sensitivity axis in a second direction perpendicular to the first direction,
wherein:
the magnetic field guide structure includes an end of a first portion facing the magnetic sensor, a second portion away from the magnetic sensor, and a third portion more away from the magnetic sensor than the second portion;
a magnetic permeability of the third portion is lower than that of the second portion
a magnetic permeability of the first portion is lower than that of the second portion,
the magnetic field guide structure comprises an alloy containing iron, and
an iron content of the third portion is lower than that of the second portion.

5. The magnetic detection device according to claim 1, wherein an iron content of the first portion is not lower than 11 mass % and not higher than 14 mass %.

6. The magnetic detection device according to claim 1, wherein a dimension of the first portion of the magnetic field guide structure in the first direction is not higher than 45% of a dimension of the magnetic field guide structure in the first direction.

7. The magnetic detection device according to claim 1, wherein
the magnetic sensor includes a magnetoresistance effect element in which a fixed magnetic layer and a free magnetic layer are laminated via a non-magnetic layer, and fixed magnetization of the fixed magnetic layer is directed in the second direction.

8. The magnetic detection device according to claim 1, wherein the magnetic field guide structure is offset to only one side of the magnetic sensor.

9. The magnetic detection device according to claim 4, wherein a coercive force of the second portion is lower than that of the first portion.

10. The magnetic detection device according to claim 4, wherein the magnetic field guide structure comprises an alloy containing iron, and an iron content of the first portion is lower than that of the second portion.

11. The magnetic detection device according to claim 4, wherein an iron content of the first portion is not lower than 11 mass % and not higher than 14 mass %.

12. The magnetic detection device according to claim 4, wherein a dimension of the first portion of the magnetic field guide structure in the first direction is not higher than 45% of a dimension of the magnetic field guide structure in the first direction.

13. The magnetic detection device according to claim 4, wherein
the magnetic sensor includes a magnetoresistance effect element in which a fixed magnetic layer and a free magnetic layer are laminated via a non-magnetic layer, and fixed magnetization of the fixed magnetic layer is directed in the second direction.

14. The magnetic detection device according to claim 4, wherein the magnetic field guide structure is offset to only one side of the magnetic sensor.

15. The magnetic detection device according to claim 4, wherein a coercive force of the second portion is lower than that of the third portion.

* * * * *